United States Patent [19]
Eichhorn et al.

[11] Patent Number: 5,998,567
[45] Date of Patent: Dec. 7, 1999

[54] RADIATION-SENSITIVE MIXTURE

[75] Inventors: Mathias Eichhorn, Niederhausen; Gerhard Buhr, Koenigstein, both of Germany

[73] Assignee: Clariant GmbH, Frankfurt am Main, Germany

[21] Appl. No.: 08/932,964

[22] Filed: Sep. 18, 1997

Related U.S. Application Data

[62] Division of application No. 08/567,775, Dec. 5, 1995, Pat. No. 5,705,317.

[30] Foreign Application Priority Data

Dec. 15, 1994 [DE] Germany ............................ 44 44 669

[51] Int. Cl.$^6$ .................................................. C08G 63/02
[52] U.S. Cl. ...................... 528/272; 430/270.1; 430/170; 430/175; 430/192; 430/326
[58] Field of Search .................................... 528/230, 272; 430/270.1, 170, 175, 192, 326

[56] References Cited

U.S. PATENT DOCUMENTS

| | | | |
|---|---|---|---|
| 2,956,884 | 10/1960 | Caldwell | 430/627 |
| 3,779,778 | 12/1973 | Smith et al. | 96/115 |
| 4,101,323 | 7/1978 | Buhr et al. | 96/35 |
| 4,247,611 | 1/1981 | Sander et al. | 430/286 |
| 4,311,782 | 1/1982 | Buhr et al. | 430/270 |
| 4,491,628 | 1/1985 | Ito et al. | 430/270.1 |
| 4,837,124 | 6/1989 | Wu et al. | 430/270.1 |
| 5,015,558 | 5/1991 | Ochi et al. | 430/325 |
| 5,034,305 | 7/1991 | Nguyen-Kim et al. | 430/270.1 |
| 5,066,572 | 11/1991 | O'Connor et al. | 430/503 |
| 5,120,629 | 6/1992 | Bauer et al. | 430/270.1 |
| 5,133,894 | 7/1992 | Gethoffer et al. | 252/174.23 |
| 5,175,348 | 12/1992 | Gallegra et al. | 560/266 |
| 5,231,221 | 7/1993 | Hertzsch et al. | 560/263 |
| 5,248,558 | 9/1993 | Bacghi et al. | 428/407 |
| 5,314,785 | 5/1994 | Vogel et al. | 430/270.1 |
| 5,318,876 | 6/1994 | Schwalm et al. | 430/270.1 |
| 5,340,676 | 8/1994 | Anderson et al. | 430/63 |
| 5,354,643 | 10/1994 | Cabrera et al. | 430/270.1 |
| 5,356,752 | 10/1994 | Cabrera et al. | 430/270.1 |
| 5,374,498 | 12/1994 | Fujita et al. | 430/264 |
| 5,389,494 | 2/1995 | Kim | 430/270.1 |
| 5,532,106 | 7/1996 | Frechet et al. | 430/270.1 |

FOREIGN PATENT DOCUMENTS

| | | |
|---|---|---|
| 0 022 571 | 1/1981 | European Pat. Off. |
| 0 102 450 | 3/1984 | European Pat. Off. |
| 0 249 139 | 12/1987 | European Pat. Off. |
| 0 366 590 | 5/1990 | European Pat. Off. |
| 0 448 006 A3 | 9/1991 | European Pat. Off. |
| 0 525 626 A1 | 2/1993 | European Pat. Off. |
| 26 10 842 | 9/1976 | Germany . |
| 27 18 254 | 11/1978 | Germany . |

OTHER PUBLICATIONS

Chem Abstracts: 127: 328694 Contrast agents comprising gas containing or gas generations.

Polymer particles or microballoons "felleveness et al" 125: 53054 "Contrast agents comprising gas containing polymer microparticles and/or microballons for diagnostic applications "Flaveness et al. " 126: 162263 "Pharmaceutical particles comprising water soluble adhesive sheet"Textshito et al" 121: 2L7553: Liquid electrostat graphic developer containing.

Dispersion resin grains "Eiichi et al." 117: 198512 Polymers containing sluster units for mosthetics and dosage forms "Flaveness et al" 112: 45672 "Carrier for electrostatic image development" "Masalxi et al. " .

Ban et al., "Metal–Free Chemically Amplified Positive Resist Resolving 0.2 Micron in X–ray Lithography".

*Primary Examiner*—Duc Truong
*Attorney, Agent, or Firm*—Foley & Lardner

[57] ABSTRACT

A radiation-sensitive mixture which contains (a) a compound of the formula (I)

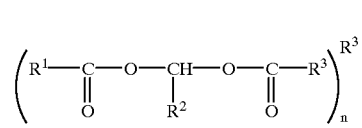

where $R^1$ is an optionally substituted alkyl radical, $R^2$ is a hydrogen atom or an optionally substituted alkyl radical containing 1 to 4 carbon atoms, $R^3$ is an n-valent, optionally polymeric aliphatic or aromatic radical and n is a number from 1 to 100; and b) a compound which forms a strong acid on exposure to actinic radiation.

16 Claims, No Drawings

RADIATION-SENSITIVE MIXTURE

This application is a division of application Ser. No. 08/567,775, filed Dec. 5, 1995 now U.S. Pat. No. 5,705,317.

BACKGROUND OF THE INVENTION

1. Field of the Invention

The invention relates to a radiation-sensitive, in particular photosensitive, mixture which contains
  (a) a compound having at least one acid-cleavable C—O—C bond, and
  (b) a compound which forms a strong acid on exposure to actinic radiation.

The invention also relates to methods of forming images using such mixtures and to acid-cleavable compounds useful in such mixtures.

2. Description of Related Art

Positive-working photosensitive mixtures whose exposed areas are more soluble in an aqueous alkaline developer liquid than the unexposed regions are known. In particular, positive-working recording materials based on o-quinone diazides have gained acceptance in practice.

The photosensitivity of these materials is frequently unsatisfactory. An increase in the photosensitivity can be achieved by using catalytically active photosensitive systems since the quantum yield becomes greater than 1 in such systems. Thus, the known principle of initiating secondary reactions by means of photolytically produced acids and thereby inducing an increased solubility of the exposed regions has been used recently for positive-working systems. Under these circumstances, photochemically produced strong acids serve to cleave acid-labile compounds whose cleavage products have a greater solubility in aqueous alkaline developers than the original compounds.

Low-molecular-weight and high-molecular-weight acetals and O,N-acetals containing aromatic compounds as hydroxyl or amino component (see U.S. Pat. No. 3,779,778), and also ortho esters and amide acetals (see DE-C 26 10 842) are used as acid-cleavable compounds. Radiation-sensitive positive-working mixtures are also obtained using polymeric ortho esters (See EP-B 0 022 571) and polymeric aliphatic acetals (See DE-C 27 18 254). Such mixtures are frequently unsatisfactory since the cleavage products obtained by acid-catalyzed fragmentation are often only inadequately soluble in aqueous alkalis and therefore result in problems in the development of such layers. In addition, many of the compounds mentioned can only be obtained with difficulty. In other cases, the storage life of the recording materials concerned is unsatisfactory in the unexposed state.

Polymers containing acid-labile tert-butyl carbonate groupings or tert-butyl carboxylate groupings which function positively in mixtures with photochemical acid donors are described in EP-B 0 102 450 and EP-A 0 366 590. An extrapolation of this principle to molecules having a molecular weight below 500 in combination with conventional binders is to be found in EP-B 0 249 139. Such systems are also not free of disadvantages: the reduced solubility inhibition of the binder matrix compared with o-quinone diazides is manifested in an unduly low resistance of the unexposed regions in the developer (so-called dark erosion) and consequently in a poor differentiation between exposed and unexposed regions.

SUMMARY OF THE INVENTION

An object of the invention was to provide radiation-sensitive mixtures which have high sensitivity to actinic radiation, in particular short-wave light, and which make possible a good differentiation between exposed and unexposed regions and which have a high storage life in the unexposed state. Within the scope of this description, actinic radiation is to be understood as meaning any radiation whose energy corresponds at least to that of visible light. Long-wave UV radiation, in particular, is suitable, but so are electron radiation, X-rays and laser radiation.

It is also an object of the invention to provide compounds that have acid-cleavable C—O—C bonds useful in radiation-sensitive mixtures, and to provide methods of forming images with such mixtures.

In accordance with these objectives, there has been provided a radiation-sensitive mixture which include
  (a) a compound having at least one acid-cleavable C—O—C bond and
  (b) a compound which forms a strong acid on exposure to actinic radiation.

In particular the mixture according to the invention is one wherein the compound (a) is a compound of the formula I

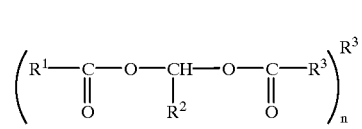

where
  $R^1$ is an optionally substituted alkyl radical,
  $R^2$ is a hydrogen atom or an optionally substituted alkyl radical containing 1 to 4 carbon atoms,
  $R^3$ is an n-valent, optionally polymeric aliphatic or aromatic radical and
  n is a number from 1 to 100.

The $R^1$ and $R^2$ groups may be the same or different in the n repeating units.

In accordance with these objectives, there is also provided a process for forming an image comprising
  (a) exposing the radiation-sensitive mixture described above, and
  (b) developing the exposed material.

Further objects, features, and advantages of the invention will become apparent from the detailed description of preferred embodiments that follows.

DETAILED DESCRIPTION OF THE PREFERRED EMBODIMENTS

Any compound or mixture of compounds having the formula (I) may be used in the present invention. In the compounds of the formula (I), the radical $R^1$ may be a saturated or unsaturated, linear or branched, substituted or unsubstituted alkyl radical. Any substituents which do not adversely affect the compound of formula (I) may be used. Suitable substituents include, for example, halogen atoms, in particular fluorine atoms, alkoxy groups containing 1 to 4 carbon atoms, and phenyl radicals. More than one substituent can be present. The total number of carbon atoms in $R^1$ should generally not be greater than 10. Particularly preferred for $R^1$ are unsubstituted, linear or branched alkyl radicals containing 1 to 6, in particular 1 to 4, carbon atoms. Secondary and tertiary alkyl radicals are particularly advantageous.

$R^2$ is hydrogen or an alkyl radical, for example, as described for $R^1$, preferably containing 1 to 4 carbon atoms. The radical $R^2$ is preferably a hydrogen atom, or a methyl or ethyl group.

In formula (I), n is an integer from 1 to 100.

In the low-molecular-weight acylals within the scope of formula (I), n is a number from 1 to 4, preferably 2 or 3. For high molecular weight acylals, n is preferably at least about 10.

$R^3$ may be any low-molecular-weight or high-molecular-weight group. As a low-molecular-weight group, $R^3$ may be aliphatic, cycloaliphatic, or aromatic. Preferred are groups which contain at least one, preferably 1 to 3, aromatic nuclei, i.e., benzene rings. These may be joined to one another by fusion or by linking by means of an intermediate member. The intermediate member may be, inter alia, a single bond or one of the groups —O—, —S—, —SO—, —SO$_2$—, —SO$_2$—O—, —CO— or —C(R$^4$)(R$^5$)—, where $R^4$ and $R^5$ are identical or different and are hydrogen atoms, methyl groups, or trifluoromethyl groups. The aromatic nuclei may be substituted, for example, by halogen atoms, alkyl or alkoxy groups containing 1 to 3 carbon atoms, alkanoyl or alkoxycarbonyl groups containing 2 to 5 carbon atoms or carboxyl groups.

If $R^3$ is an aliphatic group, it generally has 1 to 10, preferably 1 to 6, carbon atoms and may be interrupted by ethereal oxygen atoms or phenylene groups and contain double bonds. Suitable as cycloaliphatic groups $R^3$ are preferably those containing 5 or 6 ring members. They may contain one or two rings which are optionally linked by identical intermediate members such as the aromatic rings.

If $R^3$ is a polymeric group, it may contain up to approximately 100 units having lateral carboxyl groups and be derived from a homopolymer or copolymer. Suitable as comonomer units are nonacidic vinyl monomer units, for example, composed of olefins, vinyl ethers, vinyl esters, (meth)acrylates, maleates or vinylaromatics. The carboxylic acid units may be derived from α,β-unsaturated carboxylic acids, such as (meth)acrylic acid, maleic acid or maleic anhydride, crotonic acid, vinylbenzoic acid and the like. The molecular weight $M_w$ of the polymer containing carboxyl groups may be in the range from 5,000 to 200,000, preferably from 20,000 to 100,000. Copolymers of (meth) acrylic acid with (meth)acrylates are particularly preferred.

The acid-cleavable acylals of formula (I) are prepared in any desired manner, and are preferably prepared from the basic carboxylic acids $R^3(COOH)_n$ by reaction with carboxylic esters of the formula $R^1$—CO—O—CHR$^2$—X, where X is a halogen atom, in particular Cl or Br. The reaction takes place in the presence of organic bases, for example, of 1,8-diazabicyclo[5.4.0]undec-7-ene (DBU). The esters containing $R^1$=tert-butyl are particularly well suited since, in the case of the latter, the tendency to side reactions is largely suppressed by the steric screening of the carbonyl group. The polymeric acylals may also be prepared by polymerization of monomers containing acylal groups. In principle, polymers containing acylal groups in the main chain may also be used as acid-cleavable compounds in the mixtures according to the invention.

Examples of suitable $R^1$—CO—O—CHR$^2$X carboxylates include chloromethyl pivalate and 1-bromoethyl pivalate. Suitable as $R^3(COOH)_n$ carboxylic acids are: aliphatic mono- or polycarboxylic acids such as hexanoic acid, malonic acid, propanetricarboxylic acid or 1,2,3,4-butanetetracarboxylic acid and cycloaliphatic carboxylic acids such as 1,4-cyclohexanedicarboxylic acid. Particularly preferred are aromatic mono- and polycarboxylic acids such as benzoic acid, phthalic acid, isophthalic acid, terephthalic acid, benzene-1,3,5-tricarboxylic acid, 1,2,4,5-benzenetetracarboxylic acid, naphthalene-1-carboxylic acid, naphthalene-2-carboxylic acid, naphthalene-1,4-dicarboxylic acid, naphthalene-2,6-dicarboxylic acid, naphthalene-1,8-dicarboxylic acid, naphthalenetricarboxylic acids, naphthalene-1,4,5,8-tetracarboxylic acid, biphenyl-4-carboxylic acid, biphenyl-4,4'-dicarboxylic acid, diphenyl ether 4,4'-dicarboxylic acid, benzophenone-2-, -3-, and -4-carboxylic acid, 4-carboxyphenyl 4-carboxybenzenesulfonate, bis(4-carboxyphenyl)sulfone, bis(4-carboxyphenyl)methane and 2,2-bis(4-carboxyphenyl)propane. Generally, any mono- or polycarboxylic acid is suitable which, on the one hand, is nucleophilic enough under the chosen reaction conditions to enter into the desired reaction to form the acylal and, on the other hand, apart from carboxyl groups, contains no further groups capable of reacting with $R^1CO$—O—CHR$^2$X carboxylates under the chosen reaction conditions.

To produce the positive-working, radiation-sensitive mixtures according to the invention, the high-molecular-weight or low-molecular-weight acylals described of the formula

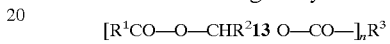

are mixed with substances which form acid photochemically or as a result of exposure to high-energy rays, and optionally with binders. The quantitative proportion of the acylals in the total solids of the mixtures are an effective amount to give the desired effect and generally are between 10 and 95, preferably 30 to 90% by weight; if binders are used, between 5 and 50, preferably between 10 and 30% by weight. As a result of using different acylals or mixtures of the same, the material properties of the recording materials produced therewith can be varied widely. Since aqueous alkaline solutions can advantageously be used as developer liquid for the exposed printing layers and such solutions are generally preferred to developers based on organic solvents, those binders are preferred, in particular, which are soluble or at least swellable in aqueous alkalis.

Any desired binders can optionally be used in the mixture of the present invention. Particularly suitable as binders are the phenolic resins used in many positive printing materials, in particular cresol-formaldehyde novolaks (generally having a melting range 105–120° C. according to DIN 53 181) and phenol-formaldehyde novolaks (generally having a melting range 110–120° C. according to DIN 53 181). Polymers containing phenolic OH groups, for example, polyhydroxystyrene and its copolymers with neutral aliphatic or aromatic monomers are also suitable.

The nature and amount of water-insoluble binder may be different depending on the application purpose; generally, its proportion of the total solids is between 0 and 95, preferably 20 to 90% by weight. If the acid-cleavable acylal is not itself polymeric, 50 to 95, preferably 70 to 90% by weight of binder are generally used.

Also suitable for use in the mixture according to the invention are binders whose alkali solubility is increased by exposure to acid. Such binders may be prepared, for example, by providing the phenolic OH groups of commercial polyhydroxystyrene binders with acid-labile groups which reduce the alkali solubility.

Other alkali-soluble resins such as copolymers of methacrylic acid and methyl methacrylate, vinyl acetate and crotonic acid, maleic anhydride and styrene and the like are also suitable as binders.

To prepare the radiation-sensitive mixtures according to the invention, the acid-cleavable compounds containing acylal groups are mixed with the binder (if binder is used) and also with one or more substances which form a strong acid photochemically or by exposure to high-energy rays.

The addition of a binder is not necessary if the acyal itself is polymeric. In this case, the polymeric acyal may contain free carboxyl groups; this is not, however, necessary since, in the case of light-induced cleavage of the acyal groups, sufficient free carboxyl groups are formed to make the exposure product alkali-soluble.

In addition, numerous other polymers can also be used in the radiation-sensitive mixtures according to the invention. Preferably vinyl polymers such as polyvinyl acetates, poly (meth)acrylates, polyvinyl ethers, and polyvinylpyrrolidones, which may themselves be modified by comonomers. The most favorable proportion of these polymers depends on the application requirements and the effect on the development conditions and is generally not more than 20% of the total solids content. In small amounts, the photosensitive layer may also contain, in addition, substances such as polyglycols, cellulose derivatives such as ethylcellulose, wetting agents, dyes and finely divided pigments for special requirements such as flexibility, adhesion, gloss, and the like.

Any desired compound or compounds that forms or releases an acid that will cleave the acid-cleavable compound of formula (I) can be used as compound (b) of the inventive mixture. For example, a large number of known compounds and mixtures, such as onium salts, for example, diazonium, phosphonium, sulfonium and iodonium salts, halogen compounds, (o-quinone diazide)sulfonyl chlorides, (o-quinone diazide)sulfonates and (o-quinone diazide) sulfonamides and also organometal/organohalogen combinations are suitable for use in the radiation-sensitive mixtures according to the invention as radiation-sensitive components which, on irradiation, preferably form or eliminate strong acids.

The onium compounds mentioned are generally used in the form of their salts which are soluble in organic solvents, for example, the sulfonates, trifluoromethanesulfonates and hexafluoropropanesulfonates, or as precipitation products with complex acids such as tetrafluoroboric acid, hexafluorophosphoric acid, hexafluoroantimonic and hexafluoroarsenic acid. The diazonium salts are particularly preferred.

Halides, esters, and amides of the positive-working o-quinone diazides can also be used. Of this group, (naphthoquinone 1,2-diazide(2))-4-sulfonyl chloride is preferred.

Basically, all the organic halogen compounds also known as photochemical free-radical starters can be used as halogen-containing radiation-sensitive compounds which form hydrohalic acid, for example, those containing more than one halogen atom on a carbon atom or on an aromatic ring. Examples are described in U.S. Pat. No. 3,779,778, DE-C 26 10 842 and DE-A 27 18 259 and DE-A 22 43 621. These documents are incorporated by reference in their entireties. The sensitivity of these halogen-containing compounds can be influenced spectrally and increased by the known sensitizers.

Examples of particularly suitable acid donors for use in the radiation-sensitive mixture according to the invention as compound (b) include: (naphthoquinone 1,2-diazide(2))-4-sulfonylchloride; 4-(di-n-propylamino)benzenediazonium tetrafluoroborate, hexafluorophosphate and trifluoromethanesulfonate; 2,5-diethoxy-4-(4-tolylmercapto) benzenediazonium tetrafluoroborate, hexafluorophosphate, trifluoromethanesulfonate and hexafluoropropanesulfonate; diphenylamine-4-diazonium sulfate and 4-diethylaminobenzenediazonium trifluoromethanesulfonate, and also the compounds cited in the examples which follow. 4-Methyl-6-trichloromethyl-2-pyrone, 4-(3,4,5-trimethoxystyryl)-6-trichloromethyl-2-pyrone, 2-trichloromethylbenzimidazole, 2-tribromomethylquinolone, 2,4-dimethyl-1-tribromoacetylbenzene, 3-nitro-1-tribromoacetylbenzene, 4,6-bis-trichloromethyl-s-triazines such as 2-(6-methoxy-2-naphthyl)-, 2-(1-naphthyl)-, 2-(4-ethoxyethyl-1-naphthyl)-, 2-(3-benzopyranyl)-, 2-(9-phenanthryl)- and 2-(4-methoxy-1-anthracyl)-4,6-bis-trichloromethyl-s-triazine can also be used.

The amount of starter compound (b) may be varied depending on its chemical nature and the composition of the mixture. In general, approximately 0.1 to 40% by weight, based on the total solids, preferably 0.2 to 25% by weight, are used. For layers having thicknesses of over 10 $\mu$m, in particular, it is advisable to use relatively little acid donor.

Soluble or, alternatively, finely dispersed dispersible dyes and also, depending on the application purpose, UV absorbers, may additionally be added to the photosensitive mixtures. The triphenylmethane dyes, in particular in the form of their carbinol bases, have proved particularly advantageous as dyes. The most favorable quantitative ratio of the components can easily be determined in the individual case by preliminary experiments.

Suitable solvents for the radiation-sensitive mixture according to the invention include ketones such as methyl ethyl ketone, chlorinated hydrocarbons such as trichloroethylene and 1,1,1-trichloroethane, alcohols such as n-propanol, ethers such as tetrahydrofuran, alcohol ethers such as propylene or ethylene glycol monomethyl ether, and esters such as butyl acetate. It is also possible to use mixtures which may also contain, in addition, solvents such as acetonitrile, dioxane or dimethylformamide for specific purposes. In principle, and solvents can be used which do not react irreversibly with the layer components.

Compared with other positive layers, particularly those based on o-naphthoquinone diazide, the production of thicker layers, i.e. layers thicker than about 10 $\mu$m, is advantageously possible with the present invention since the dependence of the photosensitivity of the mixtures according to the invention on thickness is relatively low. Exposure and processing of layer thicknesses up to approximately 100 $\mu$m and above is possible.

The radiation-sensitive mixtures of the invention may be coated on any desired substrate. Preferred bases of layers having thicknesses of more than 10 $\mu$m are plastics films which then serve as temporary bases for transfer layers. For the latter and for color films, polyester films, for example, composed of polyethylene terephthalate, are preferred. Polyolefin films, for example, polypropylene films, are also suitable.

Metals are generally used as layer bases for layer thicknesses below approximately 10 $\mu$m. The following may be used for offset printing plates: mechanically or electrochemically grained and optionally anodized aluminum which, in addition, may also be chemically pretreated, for example, with polyvinylphosphonic acid, silicates or phosphates, and in addition multi-metal plates containing Cu/Cr or brass/Cr as uppermost layer.

For letterpress plates, the mixtures according to the invention may be applied to zinc or magnesium plates and also their commercial microcrystalline alloys for powderless etching, and also to etchable plastics such as polyoxymethylene. For gravure or screen-printing forms, the mixtures according to the invention are suitable on copper or nickel surfaces as a result of good adhesion and resistance to etching. They can also be used as photoresists and in chemical milling.

The substrate is coated in any desired manner. For example, coating can be carried out directly or by dry layer transfer from the temporary base onto printed circuit board materials which are composed of insulating boards having single-sided or double-sided copper cladding, onto glass or ceramic materials which have optionally been pretreated in an adhesion-promoting manner and, inter alia, onto silicon wafers on whose surface there is optionally a nitride or oxide layer. In addition, it is possible to coat wood, textiles, and surfaces of many materials which are advantageously imprinted by projection and are resistant to exposure to alkaline developers.

The coated mixture on the substrate, may be dried as desired. The conventional appliances and conditions can be adopted for the drying after coating; temperatures of around 100° C. and, for short periods, of up to 120° C. are tolerated without loss of radiation sensitivity.

The coated substrate may be processed as desired. For the exposure, use may be made of the conventional light sources such as tubular lamps, xenon pulsed lamps, metal-halide-doped mercury-vapor high-pressure lamps and carbon-arc lamps. In addition, exposure in conventional projection and enlargement appliances under the light of metal-filament lamps is useful, as is contact exposure with conventional incandescent lamps. The exposure can also be carried out with the coherent light of a laser. Suitable for the purposes of the present invention are lasers of the correct power which emit in the UV or visible region, for example, argon ion lasers, krypton ion lasers, dye lasers, helium-cadmium lasers and excimer lasers. The laser beam is controlled by means of a specified, programmed line and/or raster movement.

Irradiation with electron beams is a further imprinting possibility. As also in the case of many other organic materials, electron beams are able to decompose and crosslink the mixture according to the invention in a radical manner so that a negative image is formed if the unirradiated parts are removed by solvent or exposure without master and development. On the other hand, at fairly low intensity and/or fairly high writing speed of the electron beam, the electron beam produces a differentiation in the direction of higher solubility, i.e., the irradiated layer areas can be removed by the developer. The choice of the most favorable conditions can easily be determined by preliminary experiments.

The imagewise exposed or irradiated layer can be removed—optionally after a thermal aftertreatment— using virtually the same developers as for commercial naphthoquinone diazide layers and photoresists, or the copying conditions of the inventive material can be adapted advantageously to the known aids such as developers and programmed spray development appliances. Any desired developers can be used in any desired developing process. The aqueous developer solutions may contain, for example, alkali metal phosphates, silicates or hydroxides and, furthermore, wetting agents, and also fairly small proportions of organic solvents. In certain cases, pure water or solvent/water mixtures are also usable as developers. The most favorable developer can be determined by experiments with the layer used in a particular case. If necessary, the development may be mechanically aided. To increase the resistance during printing and also the resistance to washing-out agents, deletion fluids and printing inks which can be cured by UV light, the developed plates can be heated to elevated temperatures for a short time, as is disclosed for diazo layers in GB-A 1 154 749.

Examples of preferred radiation-sensitive mixtures according to the invention and a synthesis of the acid-cleavable acylals they contain are specified below. The amounts are specified in parts by weight (pbw), and percentages and quantitative ratios are to be understood in units of weight. The examples are for illustrative purposes only and do not limit the scope of invention.

EXAMPLES 1–12

Reaction of Carboxylic Acids With Pivalates to Form Acylals 1 equivalent of the carboxylic acid was dissolved or suspended in acetone. 1.1 equivalents of chloromethyl pivalate or 1-bromoethyl pivalate were added per carboxylic acid unit. 1.1 equivalents of 1,8-diazabicyclo[5.4.0]undec-7-ene (DBU) per carboxylic acid unit were then added dropwise at 0° C. Stirring was still continued for some time at room temperature, or optionally at slightly elevated temperature, until the completion of the reaction (by thin-layer chromatography). After the DBU chloride or bromide precipitated had been filtered off by suction, the solvent was distilled off in a rotary evaporator, the residue was taken up in ethyl acetate and the solution was washed out consecutively with 0.1 N HCl, NaHCO$_3$ solution and H$_2$O. After drying with MgSO$_4$, concentration and optionally recrystallization were carried out. The acylals listed in Table 1 were obtained.

TABLE 1

Synthesized acylals of the formula (I) with $R^1$ = tert-butyl

| No. | $R^2$ | $R^3$ | Mp[°C.] | n |
|---|---|---|---|---|
| 1 | H | 4,4'-oxydiphenyl | 74–75 | 2 |
| 2 | CH$_3$ | | 86–88 | 2 |
| 3 | H | 1,3,5-benzenetriyl | 75–77 | 3 |
| 4 | CH$_3$ | | 103–104 | 3 |
| 5 | H | 1,4-phenylene | 88–89 | 2 |
| 6 | CH$_3$ | | 105–106 | 2 |
| 7 | H | 4-benzoylphenyl | 70–71 | 1 |
| 8 | CH$_3$ | | 63–64 | 1 |
| 9 | CH$_3$ | 4,4'-sulfonyldiphenyl (—C$_6$H$_4$—SO$_2$—C$_6$H$_4$—) | 88–91 | 2 |
| 10 | CH$_3$ | 4,4'-sulfonyloxydiphenyl (—C$_6$H$_4$—SO$_2$O—C$_6$H$_4$—) | 110–114 | 2 |
| 11 | H | biphenyl-4,4'-diyl | 118–119 | 2 |
| 12 | CH$_3$ | | 150–153 | 2 |

EXAMPLE 13

The compounds contained in Table 1 were processed to form solutions of the composition 5.00 pbw of novolak, 1.50 pbw of acylal in accordance with Table 1, 0.25 pbw of 4-p-tolylmercapto-2,5-diethoxybenzenediazonium hexafluorophosphate and 0.03 pbw of Crystal Violet base in 125.00 pbw of butanone, applied by spinning to plates composed of electrochemically grained and anodized aluminum and dried at 100° C. in a drying oven, which process resulted in a layer thickness of 1.8 to 2.0 µm. The plates were exposed under a 5 kW metal-halide lamp for 30 s at a distance of 110 cm through a continuous-tone stepped wedge having 13 steps with a density gradation of 0.15, heated for 2 minutes in a drying oven at 120° C. and developed in an aqueous alkaline developer of the composition 5.5 pbw of sodium metasilicate nonahydrate, 3.4 pbw of trisodium phosphate dodecahydrate, 0.4 pbw of anhydrous monosodium phosphate and 90.7 pbw of completely demineralized water.

Positive images of the film master were obtained.

EXAMPLE 14

This example shows the suitability of the radiation-sensitive mixtures according to the invention for use in offset printing plates.

A plate composed of electrochemically grained and anodized aluminum was coated with a solution composed of 5.00 pbw of novolak, 1.50 pbw of acylal 10 according to Table 1, 0.25 pbw of 4-p-tolylmercapto-2,5-diethoxybenzenediazonium 1,1,2,3,3,3-hexafluoropropanesulfonate and 0.03 pbw of Crystal Violet base in 125.00 pbw of butanone and heated in a drying oven at 100° C., which process resulted in a layer thickness of 1.9 μm. The plate was exposed under a 5 kW metal-halide lamp for 30 s at a distance of 110 cm through a continuous-tone stepped wedge having 13 steps with a density gradation of 0.15, heated at 150° C. for 3 minutes and developed in the developer specified in Example 13 for 30 s. A positive image of the film master was obtained; step 4 of the continuous-tone step wedge was completely open, while step 10 was reproduced in completely covered form. When clamped in an offset printing press, more than 60,000 good impressions were obtained with this plate without detectable wear of the printing layer.

EXAMPLE 15

5 pbw of a copolymer of methyl methacrylate and methacrylic acid (AN 355, equivalent to 60 mol % methacrylic acid) were dissolved in 50 pbw of dimethylacetamide. 14.5 pbw of 1-bromoethyl pivalate were added and 10.5 pbw of DBU were then added dropwise at 0° C. After 2 hours, precipitation was carried out at 50° C. in $H_2O$ and reprecipitation was carried out yet again from acetone/$H_2O$. 6.2 pbw of slightly yellow solid in which no free acid groups could be detected were obtained.

EXAMPLE 16

A plate composed of electrochemically grained and anodized aluminum was spin-coated with a solution composed of 9.00 pbw of a polymer in accordance with Example 15, 2.50 pbw of the diazo compound specified in Example 14 and 0.08 pbw of Crystal Violet base in 175.00 pbw of butanone and heated at 100° C. in a drying oven, which process resulted in a layer thickness of 1.9 μm. The plate was exposed under a 5 kW metal-halide lamp for 30 s at a distance of 110 cm through a continuous-tone stepped wedge having 13 steps with a density gradation of 0.15, heated for 2 minutes at 100° C. and developed in the developer specified in Example 13 for 60 s. A positive image of the film master was obtained; step 4 of the continuous-tone stepped wedge was completely open, while step 10 was reproduced in completely covered form. A standard Ozasol® P 61 positive printing plate (Hoechst AG) used for comparison had to be exposed for 70 s to achieve the same result.

EXAMPLE 17

The coated aluminum plate according to Example 16 was exposed under a 5 kW metal-halide lamp for 30 s at a distance of 110 cm through a continuous-tone stepped wedge having 13 steps with a density gradation of 0.15, heated for 2 minutes at 120° C. and developed by rubbing with a sponge moistened with water. A perfect image of the film master was obtained; step 2 of the continuous-tone stepped wedge was completely open, while step 6 was reproduced in completely covered form.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A compound of the formula I

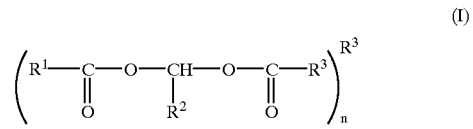

where $R^1$ is an alkyl radical, which is unsubstituted or substituted with at least one member selected from the group consisting of a halogen atom, an alkoxy group and a phenyl group, $R^2$ is a hydrogen atom or an optionally substituted alkyl radical containing 1 to 4 carbon atoms, $R^3$ is a low-molecular weight, non-polymeric n-valent, aliphatic, cycloaliphatic, or aromatic radical, and n is an integer from 1 to 4.

2. A compound of the formula I

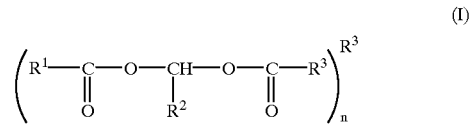

where $R^1$ is an optionally substituted alkyl radical, $R^2$ is a hydrogen atom or an optionally substituted alkyl radical containing 1 to 4 carbon atoms, n is an integer from 1 to 4, and $R^3$ is a radical containing 1 to 3 aromatic nuclei.

3. A compound as claimed in claim 1, wherein $R^1$ is an alkyl radical containing 1 to 6 carbon atoms.

4. A compound as claimed in claim 1, wherein $R^2$ is a hydrogen atom or a methyl group.

5. A compound as claimed in claim 1, wherein $R^3$ is an aliphatic group.

6. A compound as claimed in claim 5, wherein the aliphatic group of $R^3$ has 1 to 10 carbon atoms.

7. A compound as claimed in claim 1, wherein $R^3$ is an aliphatic group interrupted by an ethereal oxygen atom or phenylene group.

8. A compound as claimed in claim 1, wherein $R^3$ is an aliphatic group containing a double bond.

9. A compound as claimed in claim 1, wherein $R^3$ is a cycloaliphatic group.

10. A compound as claimed in claim 9, wherein the cycloaliphatic group contains 5 or 6 ring members.

11. A compound as claimed in claim 9, wherein the cycloaliphatic group contains one or two rings, which are optionally linked.

12. A compound as claimed in claim 1, wherein $R^2$ is a hydrogen atom.

13. A compound as claimed in claim 1, wherein $R^2$ is an unsubstituted alkyl radical containing 1 to 4 carbon atoms.

14. A compound as claimed in claim 1, wherein $R^3$ is an aromatic radical.

15. A compound as claimed in claim 14, wherein the aromatic radical contains 1 to 3 aromatic nuclei which are joined to one another by fusing or by a linking intermediate member.

16. A compound as claimed in claim 1, wherein $R^3$ is selected from the group consisting of 4,4'-oxydiphenyl, 1,3,5-benzenetriyl, 1,4-phenylene, 4-benzoylphenyl, 4,4'-sulfonyldiphenyl, 4,4'-sulfonyloxydiphenyl, and biphenyl-4-4'-diyl.

* * * * *